Feb. 10, 1970 H. DORENDORF 3,494,023

METHOD OF PRODUCING SEMICONDUCTOR INTEGRATED CIRCUITS

Filed April 21, 1966

United States Patent Office 3,494,023
Patented Feb. 10, 1970

3,494,023
METHOD OF PRODUCING SEMICONDUCTOR INTEGRATED CIRCUITS

Heinz Dorendorf, Munich, Germany, assignor to Siemens Aktiengesellschaft, Erlangen, Germany, a corporation of Germany Filed Apr. 21, 1966, Ser. No. 544,254
Claims priority, application Germany, Apr. 26, 1965, S 96,768
Int. Cl. H01l 19/00
U.S. Cl. 29—578 13 Claims

ABSTRACT OF THE DISCLOSURE

Method of producing semiconductor integrated circuits includes etching away regions of the semiconductor wafer so as to leave spaced apart electrically functionary semiconductor pieces that are to function as semiconductor devices and as interconnections in the ultimate circuit, and filling the space between the pieces with solidifying insulating material to mechanically interconnect the pieces. Prior to etching, the semiconductor wafer is cemented onto an acid-resistant carrier, and the etching and filling steps are performed while the wafer is mounted on the carrier. After solidification of the filled and insulated material the carrier is removed.

Figure 1:
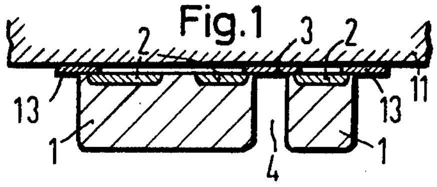

My invention relates to a method of producing semiconductor integrated circuits and similar semiconductor arrangements.

In such circuits the insulation between the individual semiconductor regions that function as electronic semiconductor devices proper, poses a difficult problem. One way of coping therewith in an electrically satisfactory manner is afforded by integrated circuits produced according to the silicon planar technique, for example, as follows. After the silicon wafer is provided with the individual regions that ultimately are to function as semiconductor devices proper, interconnecting paths of metals other than aluminum, preferably of gold, are vapor deposited upon the wafer and then electrolytically thickened. Thereafter, the regions of the wafer that will not perform any electrical function in the circuit to be produced, are eliminated so that the individual semiconductor pieces remaining are connected with each other only by the interconnections of metal.

By this special insulating method, the occurrence of capacitive couplings and leakage currents between the regions functioning as semiconductor devices proper, can be substantially avoided by the presence of insulating layers of air.

This known technique, however, leaves much to be desired in other than purely electrical respects. The individual electronic components resulting from this technique are situated in individual small blocks which are interconnected by a network of conducting metal paths of only little mechanical strength. Furthermore, there is no good heat contact between these components so that the individual component devices within the integrated circuit may possess different operating temperatures; this, in some cases, is highly detrimental to the proper functioning of the integrated circuit.

It is an object of my invention, relating to microcircuits and other integrated circuits to minimize or eliminate the above-mentioned shortcomings.

Other, more specific objects of the invention are to increase the mechanical stability of such circuits, to provide protection of the component semiconductor devices of the integrated circuit from ambient influences, particularly moisture, and additionally provide for good thermal contact between the individual components or devices proper that form part of an integrated circuit.

To achieve these objects and in accordance with my invention, semiconductor integrated circuits and similar arrangements are produced as follows. First, those regions that are to perform the function of semiconductor devices proper, such as transistors, diodes, capacitors, resistors, are produced in the conventional manner within a slab or wafer of semiconductor material such as silicon. Likewise produced in the manner heretofore known are the required electrical interconnections between the component regions proper and the regions of the semiconductor wafer that serve as input and output terminals of the integrated circuit. After these first manufacturing steps are performed in a suitable manner which need not differ from the corresponding steps of the known method of producing integrated circuits, I provide the semiconductor regions that are to function as circuit components or interconnections with a surface mask and then subject the prepared wafer to etching, thus etching away the semiconductor material of the regions that have no electrical function in the integrated circuit to be produced. The interspaces or voids resulting from the etching operation are then filled with an electrical insulating, solidifying material, preferably a synthetic plastic, so that the pieces of semiconductor material which became more or less separated by the removal of the intermediate material, are now mechanically joined with each other by solid bridges of insulating material.

According to another feature of my invention, the surface of the semiconductor integrated circuit made in the manner just described, is covered in the same or similar manner by insulating material, preferably so that this material coalesces with the material filling the above-mentioned interspaces. As a result, the stability of the semiconductor integrated circuit is further augmented, which considerably widens the fields of use and the possibilities of accommodating the circuits in various holders, frames or other supporting or housing structures. Such completely enveloped circuits can be more readily manipulated than integrated circuits made by the known techniques.

In view of the generally excellent insulation and mechanical strength afforded by hardenable casting resins, the above-mentioned synthetic plastic employed for enveloping or coating the integrated circuits, preferably consists of a material which, at the operating temperature of the completed integrated circuit, constitutes a solid and rigid substance, such as epoxide resins, silicone resins, polyester resins and similar casting or potting resins.

According to still another feature of my invention, it is preferable to attach the semiconductor slab or wafer to be processed upon a carrier of material, such as glass, which is resistant to acid, particularly the etchant. Only thereafter is the wafer subjected to the etching step that eliminates the semiconductor regions not to perform any function in the integrated circuit. The filling of the resulting interspaces with insulating material is then also effected while the wafer pieces still adhere to the carrier. After hardening of the synthetic plastic material, the carrier is removed from the semiconductor wafer, for example by dissolving the adhesive.

The casting of the plastic material into the interspaces resulting from the etching operation, as well as the enveloping of the electrical interconnections between the remaining electrically functionary regions and the terminal regions of the wafer, can be effected with the aid of a mold structure to be removed from the wafer after curing and hardening of the synthetic plastic.

However, the mold body may also be such that it serves not only as a casting or pressing mold but also as a housing component which remains joined with the semiconductor integrated circuits after completion of this latter. In this case, the material of the mold body may be adapted to that of the casting or potting mass used. In other words, the mold body may also be made of a casting or potting resin.

According to still another feature of my invention, different synthetic plastics are employed on the two sides of the semiconductor wafer, the plastics differing from each other as to consistency and type. Preferably the casting mass used for covering the wafer top side where the regions functioning as semiconductor devices are located, is provided with admixtures of the kind having a favorable effect upon the electrical properties of the semiconductor components constituted by these regions. Thus, when using the above-mentioned epoxide and other resins, it is advisable to add to the casting resin for the top side of the wafer such oxides as $B_2O_3$, CaO, $CaSO_4$ acting as drying agents, or salt-like hydrides containing predominantly anionic hydrogen, for example, calcium hydride or barium hydride. Heat dissipating substances, such as magnesium oxide or aluminum oxide, may also be added to the synthetic plastic, in which case the thermal contact, already improved by the method of the invention, can be appreciably further increased.

In one of the embodiments of the method according to the invention, the mass of synthetic plastic for filling the interspaces resulting from the etching of the semiconductor wafer, as well as the enveloping of the entire semiconductor integrated circuit, is effected by the screen printing (screen deposition) process.

Figure 2:
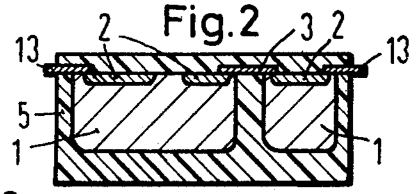
Figure 3:
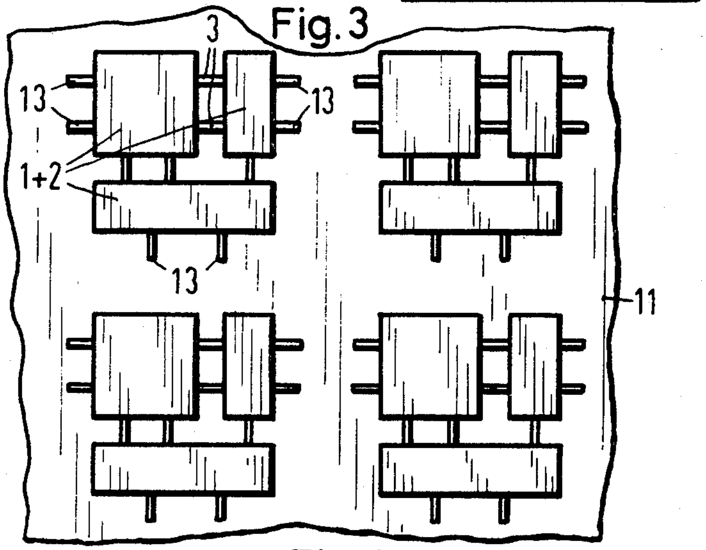
Figure 4:
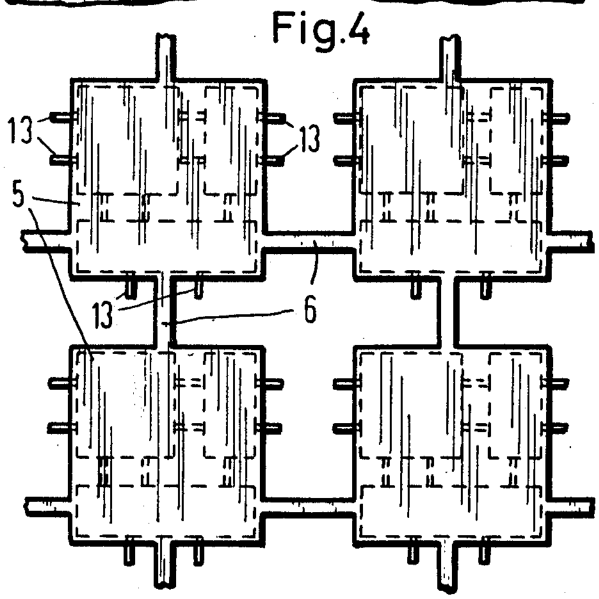

The invention will be further described with reference to the accompanying drawing in which:

FIG. 1 shows schematically and in section an integrated circuit in an intermediate stage of its production;

FIG. 2 corresponds to FIG. 1 except that it represents a subsequent stage of the process;

FIG. 3 is a top view of part of a carrier plate with several attached circuits identical with the one shown in FIG. 1 and represented at the same stage of the method as in FIG. 1; and FIG. 4 is another plan view corresponding to FIG. 3 but in a still later stage of the manufacturing method.

For producing a semiconductor integrated circuit coated with synthetic plastic according to the invention, the following data, here presented by way of example, may be observed. Used as starting material is a monocrystalline silicon circular wafer of about 25 mm. diameter. Produced in this wafer in accordance with the conventional planar technique, are the electrically functionary elements, components or devices proper of the circuit to be produced, such as transistors, diodes, resistors, capacitors. These components, therefore, correspond to respective spacially limited regions on one of the flat sides of the wafer and are connected with each other to form the electrical network of the integrated circuit. The connections are made by means of gold strips 10 to 50 microns thick and about 100 microns wide. These gold strips also form electrical terminals or terminal leads of the integrated circuit. A silicon wafer of 25 mm. diameter may comprise several hundred integrated circuits of this kind.

The top side of the wafer, this being the one where the above-mentioned functionary semiconductor components or regions are located, is attached by adhesive to an acid resistant carrier 11 (FIG. 1) such as a glass plate. Thereafter, the same regions of the semiconductor wafer are masked off on the rear side of the wafer, leaving exposed all other regions which are not to perform any electrical function in the circuit to be produced. The masking is effected in the conventional manner, for example with the aid of the photo-varnish technique. Now, the exposed regions are etched away by applying an etchant suitable for the particular semiconductor material being used. Applicable as etchant for silicon and germanium is a mixture of nitric acid and hydrofluoric acid in any of the compositions commercially available for such purposes.

When the material of the exposed regions is fully removed by the etchant, the silicon wafer is subdivided, and the individual regions that are later to function in the completed integrated circuit, are now contained in silicon pieces 1 spaced from each other by interspaces denoted by 4 in FIG. 1. However, the individual pieces of the original monocrystalline wafer remain fixed in the original positions relative to one another, since they remain cemented to the carrier plate 11. Located in each of the regions or pieces 1 are the component elements or zones 2 proper, which are produced by the conventional planar technique and which are joined with electrical interconnection strips 3 and with electrical terminal strips 13 as explained above.

After the interspaces 4 are produced by etching in the manner just described, the interspaces 4 are filled with insulating material, preferably synthetic plastic in form of a casting or potting resin. After hardening of the plastic, the carrier plate 11 is removed, and the top side of the semiconductor disc 1, at which the electrically functionary regions 2 proper as well as the electrical connections 13 are located, is covered or enveloped with electrically insulating material, preferably the same casting mass 5 (FIG. 2), such as epoxide resin. The electrical terminal leads or strips 13, serving as input and output terminals, are kept free of the casting mass so that they are subsequently accessible for attachment of conductors from the outside. However, the individual structural elements of the integrated circuit are now solidly and rigidly joined with each other by the resulting insulating bridges.

The enveloping or coating of the semiconductor integrated circuits may be effected within a mold body which simultaneously accommodates many semiconductor integrated circuits accommodated on a single semiconductor wafer, so that all of these circuits are simultaneously provided with a casting resin. The individual integrated circuits are then ultimately obtainable by subdividing the wafer after hardening of the synthetic plastic. The mold bodies are removed after hardening of the casting mass, or they may serve as a housing component and thus form part of the finished integrated circuitry. However, the casting mass may also be applied in accordance with the known screen deposition process. Such a simultaneous production of an array of integrated circuits with respective integral housings or envelopes of casting resin is exemplified by FIGS. 3 and 4.

FIG. 3 shows only part of a silicon wafer composed of individual pieces after those regions which are not to perform an electrical function in the completed integrated circuit are etched away. It will be seen that interspaces have also come about between the individual integrated circuits, each of which is composed of a number of regions or pieces of silicon. All of these interspaces are to be filled with synthetic plastic as described in the aforegoing. The reference numerals in FIG. 3 correspond to those of FIG. 1.

Shown in FIG. 4 is the same array in the stage at which the individual integrated circuits according to FIG. 3 are completely embedded in casting or potting mass and the carrier plate 11 has been removed. Insulating bridges 6 now connect the respective integrated circuits of the entire array thus increasing the mechanical stability.

It remains only necessary to subdivide the silicon wafer for obtaining the individual integrated circuits, each being solidly and rigidly enveloped and also filled with insulating plastic. The semiconductor integrated circuits thus produced are directly applicable within their plastic envelope. If desired, the circuit, inclusive of its envelope, may be mounted in a metal housing, the abovementioned terminal strips then being available for contacting the integrated circuit on the outside of its plastic envelope.

While the method of the invention has been described mainly with reference to silicon, it is also applicable to germanium and other semiconductor materials. Furthermore, the method is not limited to producing integrated or microcircuits whose individual circuit elements are made by planar techniques. Thus, the invention is applicable in the same advantageous manner to the production of groups of several microcircuit components as required for special circuitry. For example, the invention lends itself to producing a group of silicon planar transistors or silicon planar diodes, each group comprising two or more individual ones of these devices.

The method of the invention is also applicable for producing arrays of individual semiconductor components, particularly microcomponents, for example an array of identical silicon planar transistors or diodes accommodated on a single semiconductor wafer. After hardening of the casting resin, the individual transistors, diodes or other components are then obtained by correspondingly subdividing the wafer. Generally, it is difficult on account of the extremely small size of the individual semiconductor devices, to manipulate such a device for the purpose of attaching contacts, after the devices have been obtained according to the known method by correspondingly subdividing a semiconductor wafer. The method of the present invention avoids or greatly minimizes this difficulty by virtue of the fact that the contacting of several semiconductor components located on the same wafer is effected prior to enveloping or coating the wafer with plastic material. This considerably simplifies subsequently mounting the plastic-enveloped transistors or diodes into circuit devices.

To those skilled in the art it will be obvious upon a study of this disclosure that, with respect to materials, or type, variety and number of electrically functionary components, my invention is amendable to many modifications and hence may be given embodiments other than specifically disclosed herein, without departing from the essential features of my invention and within the scope of the claims annexed hereto.

I claim:

1. The method of producing semiconductor integrated circuits, which comprises providing a semiconductor wafer with electrically functionary regions to function in the completed circuit as semiconductor devices and as interconnections, then etching the semiconductor material of the other wafer regions away until the electrically functionary regions form semiconductor pieces substantially separated by etched-away interspaces, and filling the interspaces with solidifying insulating material to mechanically interconnect said semiconductor pieces by insulating bridges, cementing said semiconductor wafer onto an acid-resistant carrier prior to etching, performing the etching and filling steps while said wafer is mounted on said carrier, and removing said carrier after solidification of the filled-in insulating material.

2. The method of producing semiconductor integrated circuits according to claim 1, which comprises the step of masking said electrically functionary regions prior to etching the other regions away.

3. The method of producing semiconductor integrated circuits according to claim 1, which comprises coating the top side of the wafer with solidifying insulating material.

4. In the method of producing semiconductor integrated circuits according to claim 1, said insulating material being a synthetic casting resin which is solid at the operating temperature of the integrated circuit being produced.

5. In the method of producing semiconductor integrated circuits according to claim 4, said casting resin being material from the group consisting of epoxide-, silicone-, and polyester-resins.

6. The method according to claim 4, which comprises casting said synthetic resin into said interspaces with the aid of a mold body, and removing the mold body after hardening of the resin.

7. The method according to claim 4, which comprises casting said synthetic resin into said interspaces with the aid of a mold body, and retaining said mold body as a component part of the completed integrated circuit.

8. The method of producing semiconductor integrated circuits according to claim 1, which comprises providing a single semiconductor wafer with several integrated-circuit arrangements of said electrically functionary regions, simultaneously etching the wafer in all of said circuit arrangements, simultaneously filling with hardening synthetic plastic all of the interspaces resulting from the etching, and dividing the resulting structure after hardening of the plastic into separate integrated circuits.

9. The method of producing semiconductor integrated circuits, which comprises providing a semiconductor wafer with electrically functionary regions to function in the completed circuit as a semiconductor devices and as interconnections, then etching the semiconductor material of the other wafer regions away until the electrically functionary regions form semiconductor pieces substantially separated by etched-away interspaces, filling the interspaces with solidifying insulating material to mechanically interconnect said semiconductor pieces by insulating bridges, and covering top and bottom faces of the resulting integrated circuit with respectively different synthetic insulating materials.

10. The method of producing semiconductor integrated circuits according to claim 9, wherein said synthetic insulating material for the top face, at which said electrically functionary regions are located, contains an admixture of metal oxide.

11. The method according to claim 10, wherein said oxide is magnesia or alumina.

12. In the method of producing semiconductor integrated circuits according to claim 9, wherein said synthetic insulating material for the top face, at which said electrically functionary regions are located, contains an admixture of calcium hydride or barium hydride.

13. The method of producing semiconductor circuit components, such as for microcircuits, which comprises providing a semiconductor wafer with electrically functionary regions to ultimately function as respective semiconductor components, then masking said regions and etching the other semiconductor material of the wafer away so that the electrically functionary regions form semiconductor pieces substantially separated by interspaces, filling the interspaces with solidifying insulating material to mechanically interconnect said semiconductor pieces by insulating bridges, cementing said semiconductor wafer onto an acid-resistant carrier prior to etching, performing the etching and filling steps while said wafer is mounted on said carrier, removing said carrier after solidification of the filled-in insulating material, and ultimately subdividing the results integral structure into the individual circuit components.

References Cited

UNITED STATES PATENTS

| | | | |
|---|---|---|---|
| 3,076,051 | 1/1963 | Haba. | |
| 3,158,788 | 11/1964 | Last | 317—101 |
| 3,271,625 | 9/1966 | Caracciolo | 317—101 |
| 3,307,239 | 3/1967 | Lepselter et al. | 29—591 |

WILLIAM I. BROOKS, Primary Examiner

U.S. Cl. X.R.

29—580, 588; 156—17; 317—101